United States Patent
Wu

(10) Patent No.: US 6,703,661 B2
(45) Date of Patent: Mar. 9, 2004

(54) CONTACTLESS NOR-TYPE MEMORY ARRAY AND ITS FABRICATION METHODS

(76) Inventor: Ching-Yuan Wu, 1F, No. 23, R&D Rd. 1, Science-Based Industrial Park, Hsinchu (TW)

(*) Notice: Subject to any disclaimer, the term of this patent is extended or adjusted under 35 U.S.C. 154(b) by 0 days.

(21) Appl. No.: 10/034,652

(22) Filed: Dec. 27, 2001

(65) Prior Publication Data

US 2003/0122181 A1 Jul. 3, 2003

(51) Int. Cl.[7] .................................. H01L 29/788
(52) U.S. Cl. .................. 257/315; 257/314; 257/316; 257/321; 365/185.1; 365/185.13; 365/185.17
(58) Field of Search ................. 257/314, 315, 257/321, 316; 365/185.1, 185.13, 185.17; 438/257

(56) References Cited

U.S. PATENT DOCUMENTS

2002/0003253 A1 * 1/2002 Kitamura et al. ........... 257/315
2002/0036927 A1 * 3/2002 Mori et al. .............. 365/185.33

OTHER PUBLICATIONS

S. Aritome, "Advanced Flash Memory Technology and Trends for File Storage Application", 2000, *IEDM Technical Digest*, pp. 33.1.1–33.2.4.

S. Wolf and R.N. Tabuer, "Dry–Etching Various Types of Thin Films", 1986, *Dry Etching for VLSI Fabrication*, pp. 555–558.

James D. Plummer et al., "Silicon VLSI Technology, Chapter 10: Etching", 2000, *Manufacturing Methods*, pp. 641–650.

* cited by examiner

*Primary Examiner*—Jerome Jackson
*Assistant Examiner*—Matthew C. Landau
(74) *Attorney, Agent, or Firm*—Dickinson Wright PLLC

(57) ABSTRACT

A contactless NOR-type memory array of the present invention comprises a plurality of integrated floating-gate layers formed on a shallow-trench isolation structure, a plurality of word lines having an interlayer dielectric layer formed on an elongated control-gate layer for each word line, a plurality of common-source bus lines having a silicided conductive layer formed over a flat bed for each common-source line and, a plurality of bit lines with each bit line being integrated with a plurality of silicided conductive islands formed on the common-drain diffusion regions. The contactless NOR-type memory array of the present invention offers a cell size of $4F^2$, no contact problems for shallow source/drain junction of the cell, lower common-source bus line resistance and capacitance, and better density*speed*power product as compared to existing NAND-type memory array.

20 Claims, 10 Drawing Sheets

CONTACTLESS NOR-TYPE MEMORY ARRAY AND ITS FABRICATION METHODS

FIELD OF THE INVENTION

The present invention is related generally to a non-volatile semiconductor memory array and its fabrication methods, and more particularly, to a contactless NOR-type non-volatile semiconductor memory array and its fabrication methods for high-density mass storage applications.

DESCRIPTION OF THE RELATED ART

A semiconductor memory is in general organized in a matrix form having a plurality of rows perpendicular to a plurality of columns. The intersection of one row and one column has a storage element called a memory cell and each memory cell is capable of storing a binary bit of data. Each of the plurality of rows represents a word line and each of the plurality of columns represents a bit line. A decoder system including a row decoder block and a column decoder block is used to generate the binary-coded input in order to select the desired row or column for a write or read operation. Basically, the speed*power*density product is a figure of merits for evaluating the performance of a semiconductor memory. In general, the cell size is a major concern for high-density mass storage applications; the RC delay time of the word line and the bit line is a major concern for high-speed write or read operation; and the operation current and voltage during a write or a read is a major concern for operation power.

A flash memory is in general organized in a NAND-type configuration or a NOR-type configuration. A NAND-type flash array having a byte of cells formed in series with sharing source/drain diffusion regions has a density that is about twice of a NOR-type flash array. However, the access time is slow for a NAND-type array due to the series-connected nature of cells and, therefore, a NAND-type array is limited to 16 cells in series in order to avoid excessive series resistance. Moreover, a NAND-type array is in general programmed by Fowler-Nordheim tunneling between the overlapping area of a drain diffusion region of a cell and its floating gate and the programming speed of a NAND-type array is relatively slow as compared the hot-electron injection used often by a NOR-type array. In additions a high-voltage is needed to be applied to the word lines of the unselected cells, the complicated support circuits are required for a NAND array. Therefore, the only advantage of a NAND-type array is the density and the cell size can be made to be $4F^2$ ($2F\times 2F$), where F is the minimum-feature-size of technology used.

A typical NOR-type array is shown in FIG. 1, where FIG. 1A shows a simplified top plan view of a 2×2 array; FIG. 1B shows a schematic circuit diagram of FIG. 1A; FIG. 1C shows a cross-sectional view along A–A' direction in FIG. 1A; and FIG. 1D shows a cross-sectional view along B–B' direction in FIG. 1A. Now, referring to FIG. 1A, the active region of a NOR-type array is defined and formed on a p-semiconductor substrate 10 and the isolation region (outside of the active region) is formed with a thicker field-oxide layer (FOX), in which a larger active region is defined for forming a contact. A thin tunneling-oxide layer is formed over the active region, then a floating-gate (FE) made of doped polycrystalline silicon is formed over the thin tunneling-oxide layer and the field-oxides (FOX) and is patterned to have a portion remained on the field-oxides to increase the coupling ratio of the floating-gate, as shown in FIG. 1D. An intergate dielectric layer of the oxide-nitride-oxide (ONO) structure is formed over the patterned floating-gate layer and the field-oxides, then a control-gate (CG) layer is formed over the intergate dielectric layer and is patterned to form the word lines (WL) and the stack-gate regions of the cells, as shown in FIG. 1A and FIG. 1C. The no source/drain diffusion regions are formed in a self-aligned manner in the semiconductor substrate 10 by using the patterned word lines as an implantation mask, as shown in FIG. 1C. A tick interlayer dielectric layer made of oxide is formed over the structure and is planarized, then the contact holes are open and filled with the metal plugs, as shown FIG. 1C. A metal film is deposited over the planarized structure and is then patterned to form the bit lines (BL) perpendicular to the word lines, as shown in FIG. 1A and FIG. 1C, in which each of the bit lines is electrically connected to the drain diffusion regions of the cells in a column through the contact holes being filled with the metal plugs. As shown in FIG. 1A, the unit cell area as marked by the dash line is at least $8F^2$ if the space between the contact and the word line is F. It is quite clear that the contact in a cell of a NOR-type array becomes a major obstacle for reducing the cell size.

It is therefore an object of the present invention to provide a contactless NOR-type non-volatile memory array with a much reduced cell size.

It is another object of the present invention to provide methods of making a contactless NOR-type non-volatile memory array with a cell size of $4F^2$.

SUMMARY OF THE INVENTION

A contactless NOR-type memory array and its fabrication methods are disclosed by the present invention. A contactless NOR-type memory array comprises: a plurality of parallel isolation regions being formed alternately on a semiconductor substrate of a first conductivity type with a plurality of active regions formed therebetween, wherein in a raised field-oxide film is formed on each of the plurality of parallel isolation regions and a thin tunneling-dielectric layer is formed on each of the plurality of active region; a plurality of word lines being formed alternately and transversely to the plurality of parallel isolation regions, wherein each of the plurality of word lines comprises an elongated control-gate layer being sandwiched between an interlayer dielectric layer formed on the top and an intergate dielectric layer formed at the bottom, and a plurality of integrated floating-gate layers being formed beneath the intergate dielectric layer, wherein each of the plurality of integrated floating-gate layers comprises a major floating-gate layer being formed on the thin tunneling-dielectric layer and two extended floating-gate layers being formed separately on a portion of each of two nearby raised field-oxide films; a plurality of common-source diffusion regions being formed along the common-source lines and a plurality of common-drain diffusion regions being formed along the common-drain lines; a plurality of dielectric spacers being formed over the sidewalls of each of the plurality of word lines, wherein the raised field-oxide films along each of the common-source lines are etched to set up a flat bed formed alternately by the common-source diffusion regions and the etched field-oxide films; a silicided common-source conductive layer being formed between a pair of dielectric spacers and over a flat bed with a second thick-oxide layer formed on the top; a silicided common-drain conductive island being formed between another pair of dielectric spacers and on each of the plurality of common-drain diffusion regions and a portion of two raised field-oxide films formed nearby;

and a plurality of bit lines being formed transversely to the plurality of word lines having each of the plurality of bit lies formed over a flat surface formed alternately by second thick-oxide layer, interlayer dielectric layer, and silicided common-drain conductive islands, wherein each of the plurality of bit lines comprises a hard masking layer being formed on a metal layer to simultaneously pattern and form the metal layer and said silicided common-drain conductive islands along each of the plurality of bit lines.

The plurality of parallel isolation regions can be formed by using either shallow-trench-isolation (STI) technique or local-oxidation of silicon (LOCOS) techniques; the elongated control-gate layer is preferably a composite conductive layer having a refractory-metal silicide layer formed over a doped polycrystalline-silicon layer; the interlayer dielectric layer is preferably a composite dielectric layer having a capping silicon-nitride layer formed on a first thick-oxide layer or an insulator layer of low dielectric constant; the intergate dielectric layer is preferably a composite dielectric layer having an oxide-nitride-oxide structure or a nitride-oxide structure; the hard masking layer comprises a masking dielectric layer and its two sidewall dielectric spacers and is preferably made of silicon nitrides, silicon-oxynitrides or silicon oxides; the integrated floating-gate layer is preferably made of doped polycrystalline-silicon or doped amorphous-silicon; the dielectric spacers formed over the sidewalls of the plurality of word lines are preferably made of silicon-oxides, silicon-oxynitrides, silicon-nitride, or dielectric materials of low dielectric constant; the silicided common-source conductive layer and the silicided common-drain conductive island are preferably a refractory-metal suicide layer formed on a doped polycrystalline-silicon or doped amorphous-silicon layer; the metal layer is preferably made of aluminum (Al), copper (Cu), tungsten (W), or tungsten-silicide ($WSi_2$) formed on a barrier-metal layer such as titanium-nitride (TiN) or tantalum-nitride (TaN); the common-source diffusion region is preferably a double-diffused structure having a heavily-doped source diffusion region of a second conductivity type formed within a lightly-doped source diffusion region of the second conductivity type; the common-drain diffusion region can be a heavily-doped drain diffusion region of a second conductivity type or a double-diffused structure having a heavily-doped diffusion region of second conductivity type formed within a lightly-doped diffusion region of either a first conductivity type or a second conductivity type.

The contactless NOR-type memory array of the present invention may offer the following advantages and features: a cell size of $4F^2$, no contact problems for shallow source/drain junction, lower common-source bus line resistance and capacitance, lower common-source junction leakage current, and better density*speed*power product as compared to existing NAND-type memory array.

BRIEF DESCRIPTION OF THE DRAWINGS

FIG. 1A through FIG. 1D show the schematic diagrams of the prior art, in which FIG. 1A shows a simplified top plan view of a NOR-type flash memory array; FIG. 1B shows a circuit diagram of a NOR-type flash memory array; FIG. 1C shows a cross-sectional view along A–A' in FIG. 1A; and FIG. 1D shows a cross-sectional view along B–B' in FIG. 1A;

FIG. 2A through FIG. 2F show the schematic diagrams of the present invention, in which FIG. 2A shows a top plan view of a contactless NOR-type flash memory array; FIG. 2B shows a circuit diagram of a contactless NOR-type flash memory array; FIG. 2C shows a cross-sectional view along A–A' in FIG. 2A; FIG. 2D shows a cross-sectional view along B–B' in FIG. 2A; FIG. 2E shows a cross-sectional view along C–C' in FIG. 2A; and FIG. 2F shows a cross-sectional view along D–D' in FIG. 2A;

DETAILED DESCRIPTION OF THE PREFERRED EMBODIMENTS

Figure 1A:
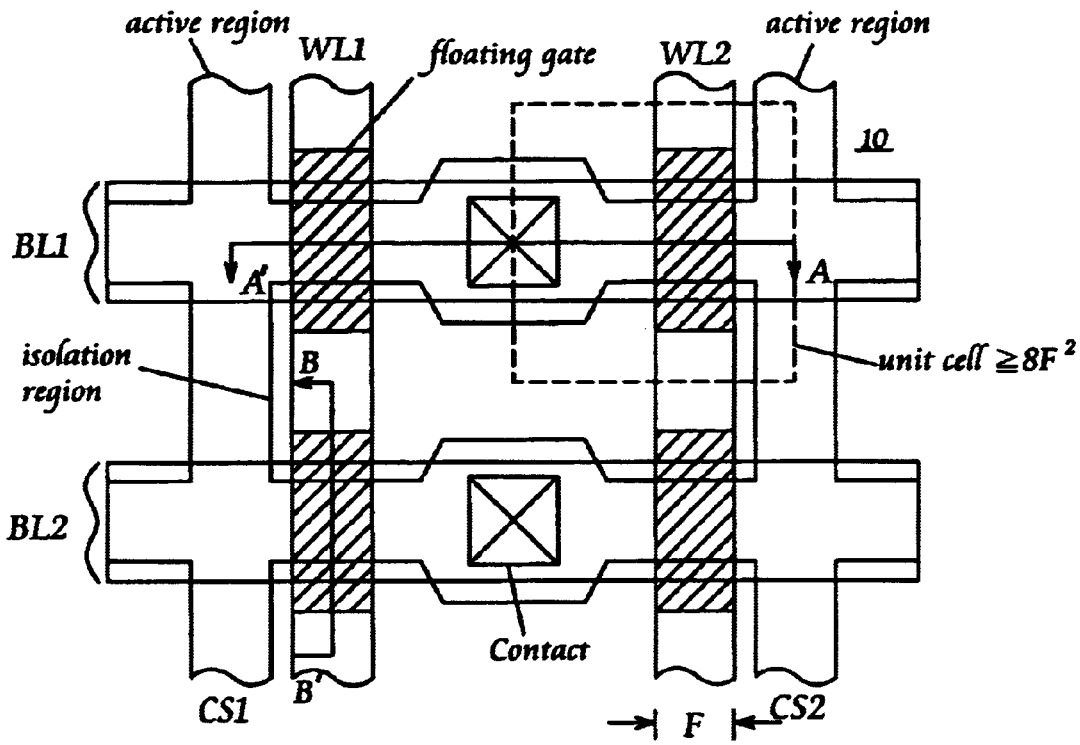
Figure 1B:
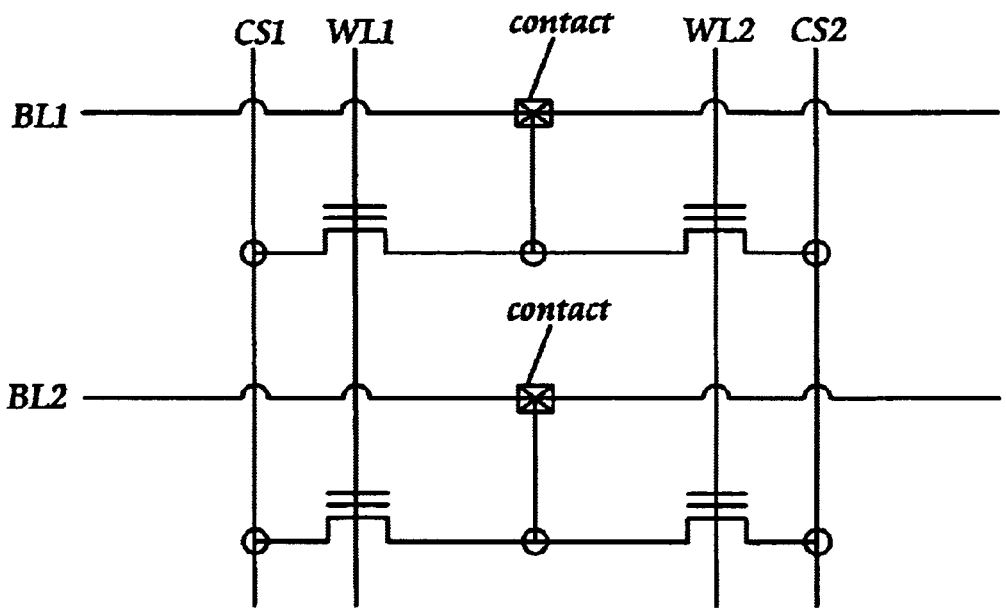
Figure 1C:
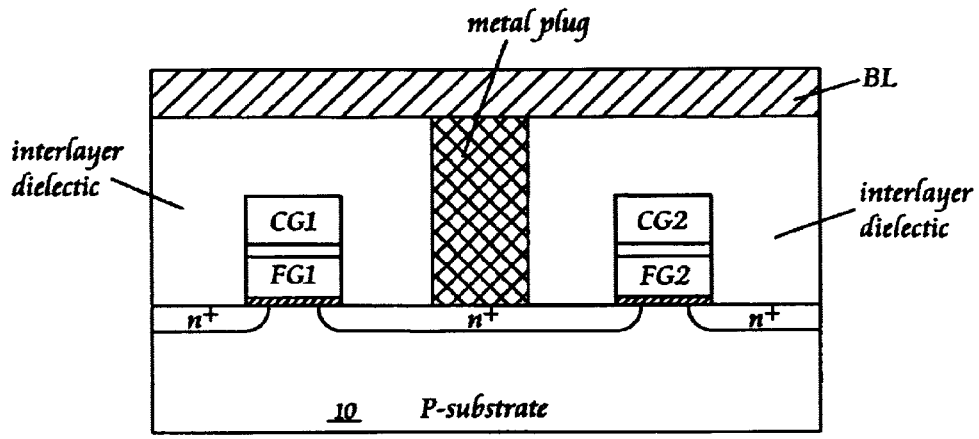
Figure 1D:
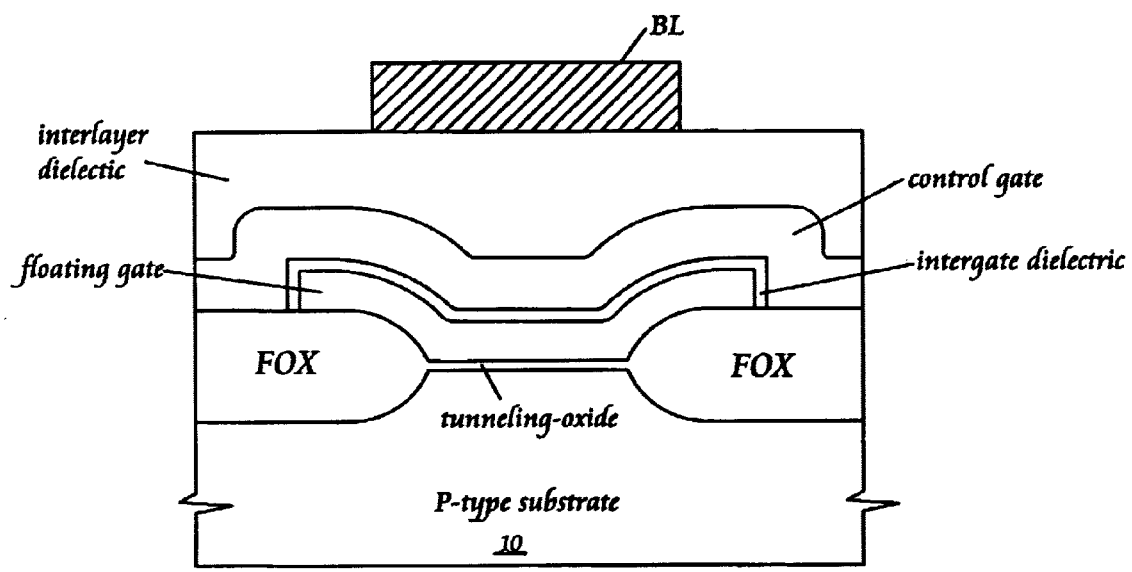
Figure 2A:
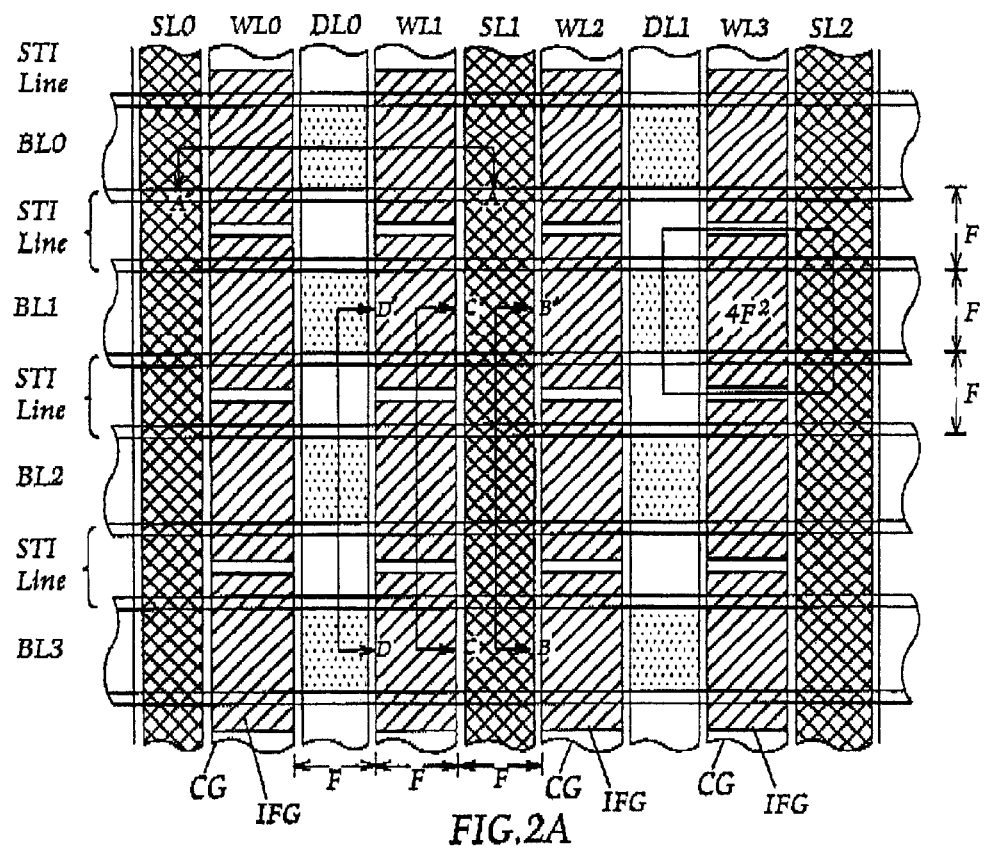

Referring now to FIG. 2A, there is shown a top plan view of a contactless NOR-type flash memory array. A plurality of shallow-trench-isolation lines (STI lines) are formed alternately in a semiconductor substrate 100 with a plurality of active-region lines formed therebetween. A plurality of word lines (WL0~WL3) are formed alternately and are perpendicular to the plurality of STI lines, in which a plurality of integrated floating-gate layers (IFG) are formed beneath an elongated control-gate layer (CG) being acted as a word line. Each of the plurality of integrated floating-gate layers has a major floating-gate layer formed over a thin tunneling dielectric layer in al active-region line and two extended floating-gate layers formed separately on a portion of each of two field-oxides (FOX) in the nearby STI lines. An interlayer dielectric layer including a second masking dielectric layer over a first tick-oxide layer is formed over the elongated control-gate layer. A plurality of common-source bus lines (SL0~SL2) are formed alternately in every two word lines and each of the plurality of common-source bus lines is formed between two nearby word lines, in which a silicided fourth conductive layer is formed over a flat bed located between two sidewall dielectric spacers having the flat bed formed alternately by the source diffusion regions and the planarized field-oxides. A plurality of bit lines (BL0~BL3) are formed alternately and are perpendicular to the plurality of word lines, in which each of the plurality of bit-lines is formed above each of the plurality of active-region lines and is formed on a plurality of silicided fourth conductive islands being formed on a plurality of common-drain diffusion regions. As indicated in FIG. 2A, the cell size of a contactless NOR-type memory array is $4F^2$, where F is the minimum-feature-size of technology used.

Figure 2B:
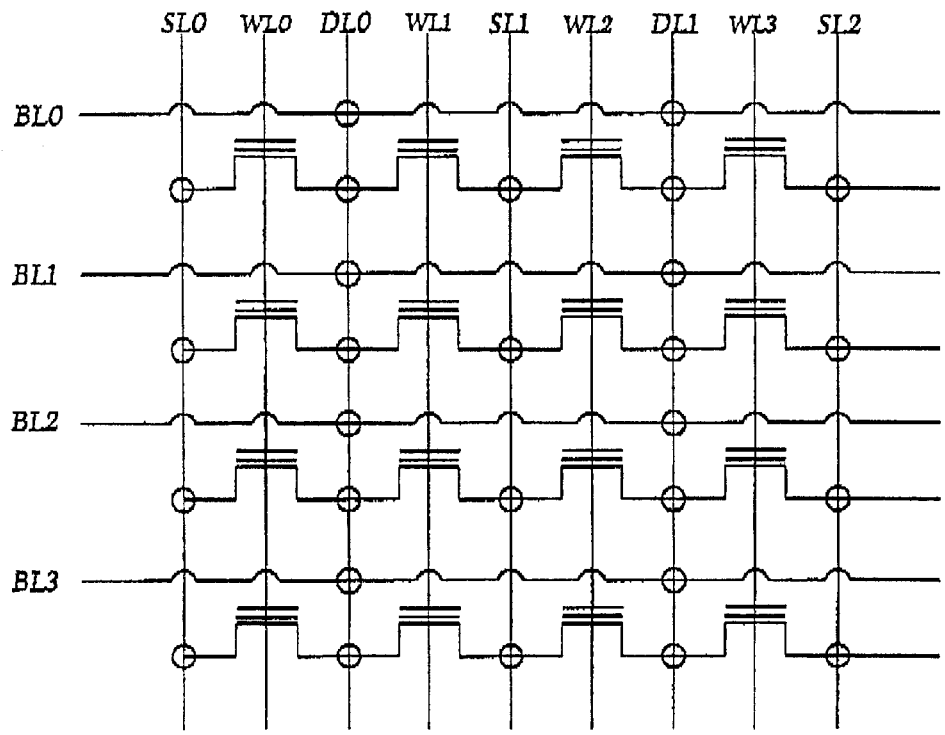

FIG. 2B shows a circuit diagram of FIG. 2A, where the circle marked at the intersection point of the lines represents an interconnection rater than a contact.

Figure 2C:
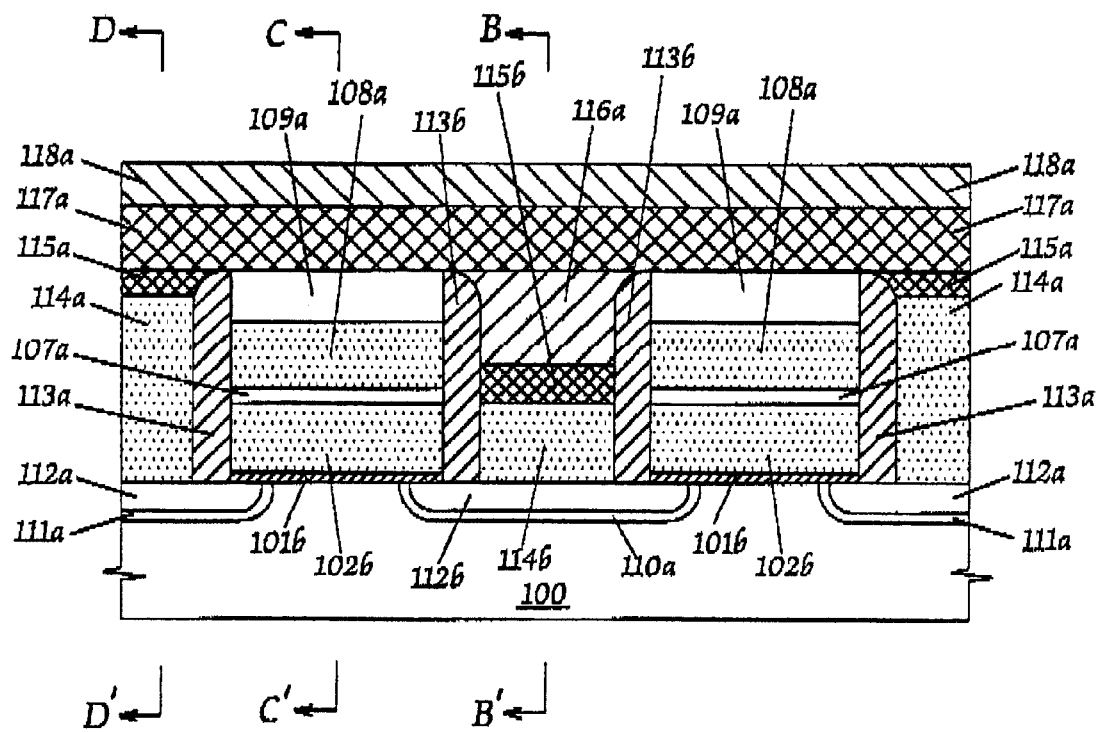
Figure 2D:
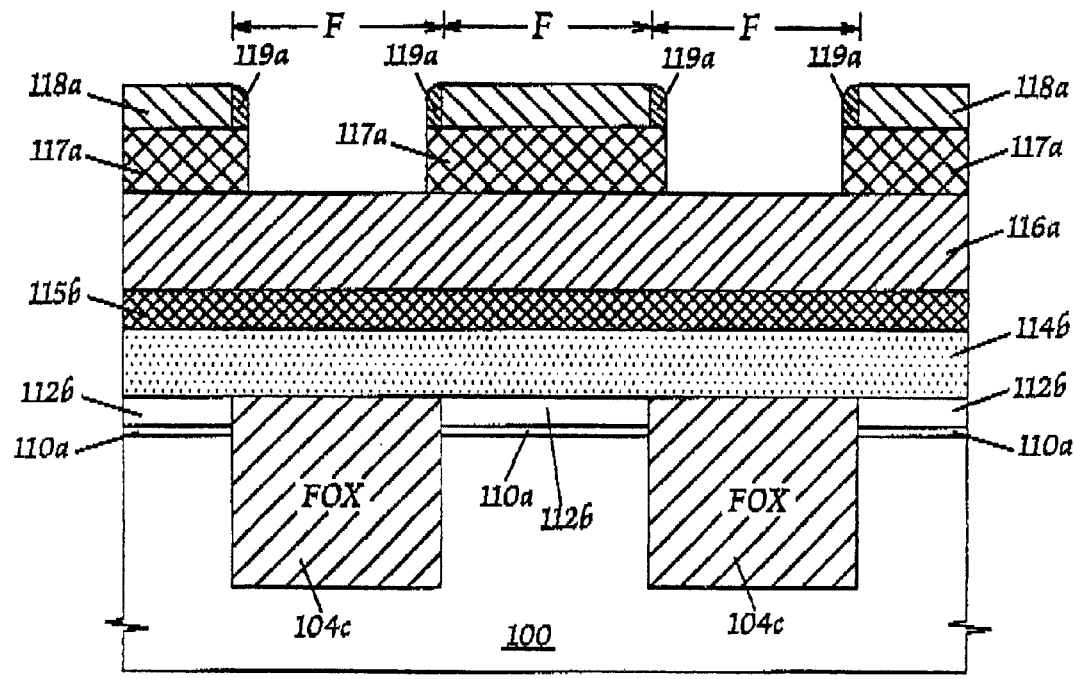
Figure 2E:
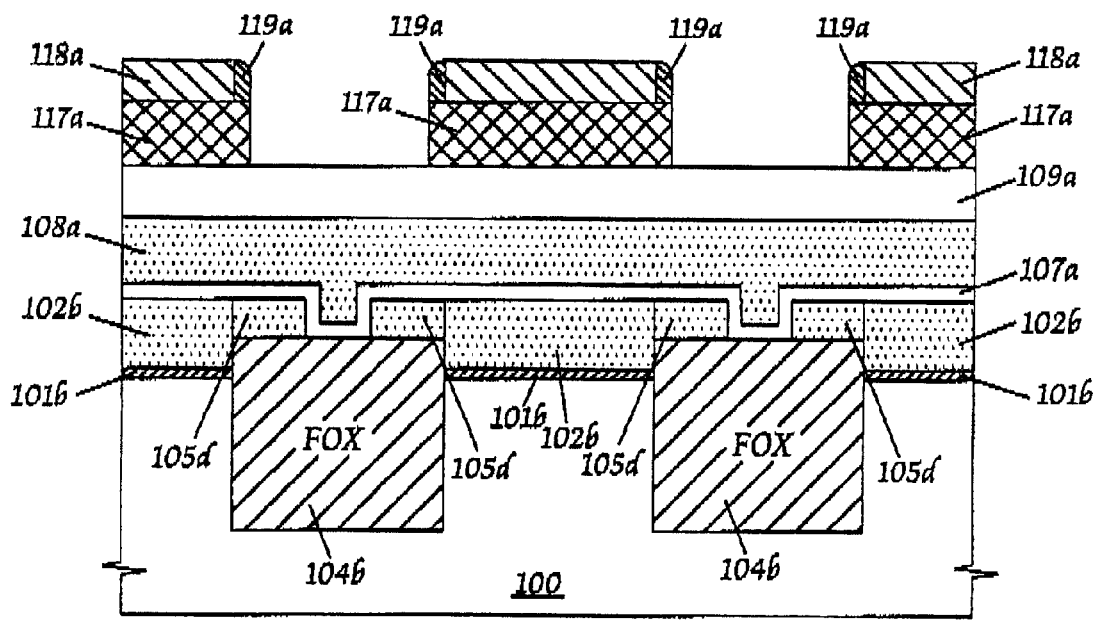
Figure 2F:
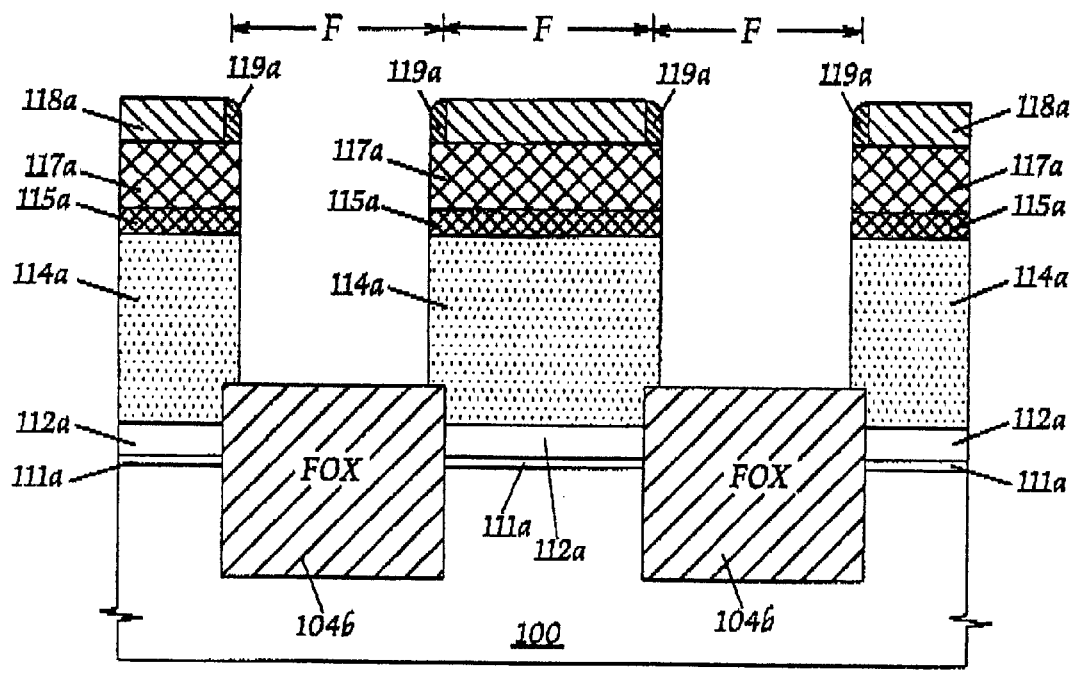

Referring now to FIG. 2C through FIG. 2F, there are shown various cross-sectional views as indicated in FIG. 2A, in which FIG. 2C shows a cross-sectional view along A–A'; FIG. 2D shows a cross-sectional view along B–B'; FIG. 2E shows a cross-sectional view along C–C'; and FIG. 2F shows a cross-sectional view along D–D'. As shown in FIG. 2C, a metal layer 117a acted as a bit line (BL) is formed over a plurality of tree regions, where each of the plurality of three regions includes a common-source region, a word-line region and a common-drain region. The word-line region comprises from top to bottom an interlayer dielectric layer 109a, a control-gate layer 108a, and an intergate dielectric layer 107a, a major floating-gate layer 102b, and a thin tunneling dielectric layer 101b formed on a semiconductor substrate 100. The common-source region includes two dielectric spacers 113b being formed over the sidewalls of the word-line regions, and between two dielectric spacers 113b comprises from top to bottom a second thick-oxide layer 116a, a silicide layer 115b, a fourth conductive layer 114b, a heavily-doped (n$^+$) source diffusion region 112b, and a lightly-doped (n$^-$) source diffusion region 110a. The common-drain region includes two dielectric spacers 113a being formed over the sidewalls of the word lines, and between two sidewall spacers 113a comprises from top to bottom a silicide layer 115a, a fourth conductive layer 114a, a heavily-doped (n$^+$) drain diffusion region 112a, and a lightly-doped (p$^-$) drain diffusion region 111a. Note that the lightly-doped (p$^-$) drain diffusion region 111a is mainly used to tailor the drain electric field and further to reduce the punch-through effects of a memory cell. The lightly-doped (p$^-$) drain diffusion region 111a can be deleted or substituted by the lightly-doped (n$^-$) drain diffusion region, depending on the programming requirement. The third masking dielectric layer 118a with its two third dielectric spacers 119a formed on the bit line 117a is mainly used to define the bit line width, as will be clearly described later.

FIG. 2D shows a cross-sectional view along B–B' in FIG. 2A, which is a cross-sectional view along a common-source line (SL). As shown in FIG. 2D, a fourth conductive layer 114b capped with a silicide layer 115b is formed on a flat bed being formed alternately by the planarized field-oxides (FOX) 104c and the heavily-doped (n$^+$) source diffusion regions 112b. A second thick-oxide layer 116a is formed over the silicide layer 115b and the bit lines 117a are formed above the active-region lines. The width of a bit line is defined by a third masking dielectric layer 118a and its two third dielectric spacers 119a formed over the sidewalls of the third masking dielectric layer 118a, and therefore, the width of a bit line is wider than a minimum-feature size (F) and the space of the bit lines can be made to be smaller than a minimum-feature-size (F) for a minimum metal pitch of 2F. It is clearly seen that the common-source bus line of a contactless NOR-type memory array will give lower bus-line resistance, lower bus-line capacitance, and lower junction leakage current as compared to those of the n+ buried common-source line of the prior art.

FIG. 2E shows a cross-sectional view along C–C' in FIG. 2A, which is a cross-sectional view along a word line. As shown in FIG. 2E, a plurality of integrated floating-gate layers are formed along a word line and each of the plurality of integrated floating-gate layers includes a major floating-gate layer 102b formed on a thin tunneling dielectric layer 101b and two extended floating-gate layers 105d formed separately on a portion of each of two nearby field-oxides (FOX) 104b. An intergated dielectric layer 107a is formed over the plurality of integrated floating-gate layers and the field-oxides 104b; the elongated control-gate layer 108a is formed over the intergated dielectric layer 107a; and an interlayer dielectric layer 109a is formed over the elongated control-gate layer 108a. Similarly, the bit lines 117a are patterned and formed over the interlayer dielectric layer 109a as shown in FIG. 2D.

FIG. 2F shows a cross-sectional view along D–D' in FIG. 2A, which is a cross-sectional view along a common-drain line (DL). As shown in FIG. 2F, a plurality of bit lines 117a are formed by a hard masking layer including a third masking dielectric layer 118a and its two third dielectric spacers 119a, and the fourth conductive layer 114a capped with a silicide layer 115a are etched down in a self-aligned manner to the raised field-oxides 104b. It is clearly seen that the dielectric spacers 119a are mainly used to eliminate the misalignment of photolithography and, therefore, the original contact area between the fourth conductive layer 114a and the heavily-doped drain diffusion region 112a will not be changed It should be noted that the gaps between the bit lines can be refilled with planarized CVD oxides before or after the third masking dielectric layer 118a and their sidewall spacers 119a are removed.

Based on the above description, the advantages and features of the present invention are summarized as follows:

(a) The contactless NOR-type memory array of the present invention can offer much smaller cell size as compared to that of the conventional NOR-type memory array having the bit-line contacts;

(b) The contactless NOR-type memory array of the present invention can offer a minimum cell size of $4F^2$ which is equivalent to that of the NAND-type memory array;

(c) The contactless NOR-type memory array of the present invention doesn't have the contact problems for a shallow source/drain junction, therefore the source/drain junction depth in a cell can be easily scaled down;

(d) The contactless NOR-type memory array of the present invention can offer a common-source bus line with lower bus-line resistance, lower bus-line capacitance, and lower bus-line junction leakage current; and (e) The contactless NOR-type memory array of the present invention offers a much better density*speed*power product and much simpler peripheral circuits for write, read and erase as compared to the NAND-type memory array.

Figure 3A:
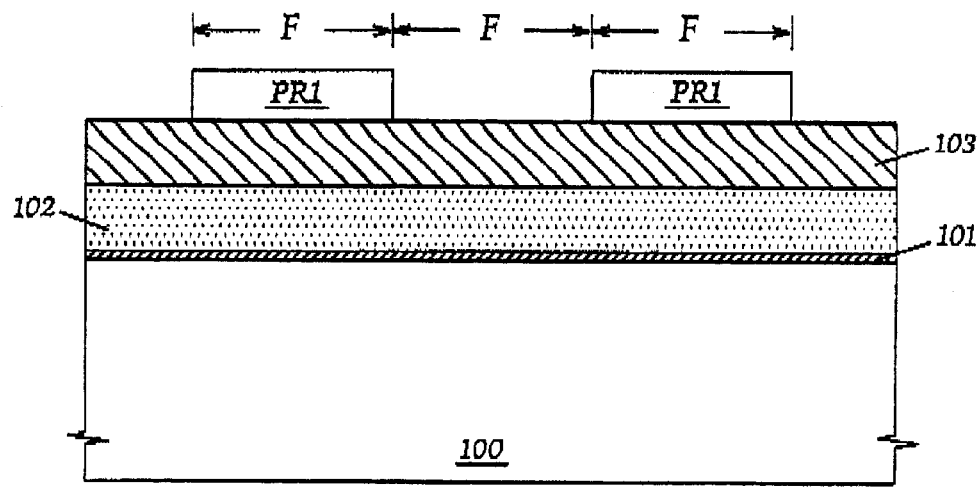
FIG. 3A through FIG. 3F show the process steps and their cross-sectional views of fabricating a shallow-trench-isolation (STI) structure having the integrated floating-gate structure.

Referring now to FIG. 3A through FIG. 3F, there are shown the process steps and their cross-sectional views for forming a shallow-trench-isolation structure having an integrated floating-gate structure for each of flash memory cell in a flash memory array. As shown in FIG. 3A, a thin tunneling dielectric layer 101 is formed on a semiconductor substrate 100, a first conductive layer 102 is formed on the thin tunneling dielectric layer 101, and a first masking dielectric layer 103 is then formed on the first conductive layer 102. The thin tunneling dielectric layer 101 is preferably a thermal-oxide layer or a nitrided thermal-oxide layer having a thickness between 60 Å and 150 Å. The first conductive layer 102 is preferably a doped polycrystalline-silicon or a doped amorphous-silicon layer having a thickness between 1000 Å and 3000 Å and is preferably deposited by low-pressure chemical-vapor-deposition (LPCVD). The first masking dielectric layer 103 is preferably a silicon-nitride layer having a thickness between 1000 Å and 5000 Å and is preferably deposited by LPCVD. The patterned photoresist PR1 is formed on the first masking dielectric layer 103 to define a plurality of shallow-trench-isolation (STI) lines with a plurality of active-region lines (covered by PR1) formed therebetween. Note that the minimum-feature-size F can be used to define the width and the space of the patterned photoresist PR1.

Figure 3B:
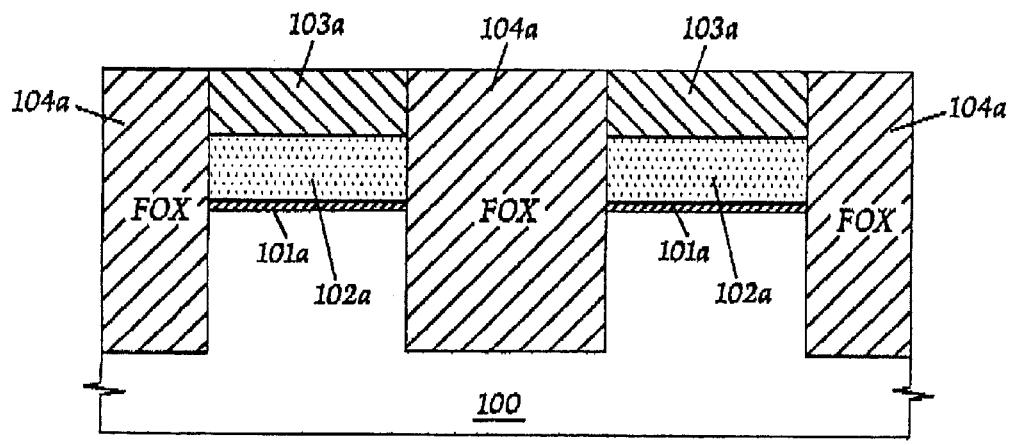

FIG. 3B shows that the first masking dielectric layer 103, the first conductive layer 102, and the thin tunneling dielectric layer 101, which are not covered by PR1, are anisotropically etched and the semiconductor substrate 100 is anisotropically etched to form a plurality of shallow trenches, and then the patterned photoresist PR1 is stripped. Subsequently, a thick oxide film 104 is deposited by CVD or high-density plasma CVD to fill up the etched gaps and the planarization is performed by chemical-mechanical polishing (CMP) with the first masking dielectric layer 103a as a polishing stop to form the planarized field-oxides (FOX) 104a, as shown in FIG. 3B. The depth of shallow trenches formed in the semiconductor substrate is preferably between 3000 Å and 8000 Å.

Figure 3C:
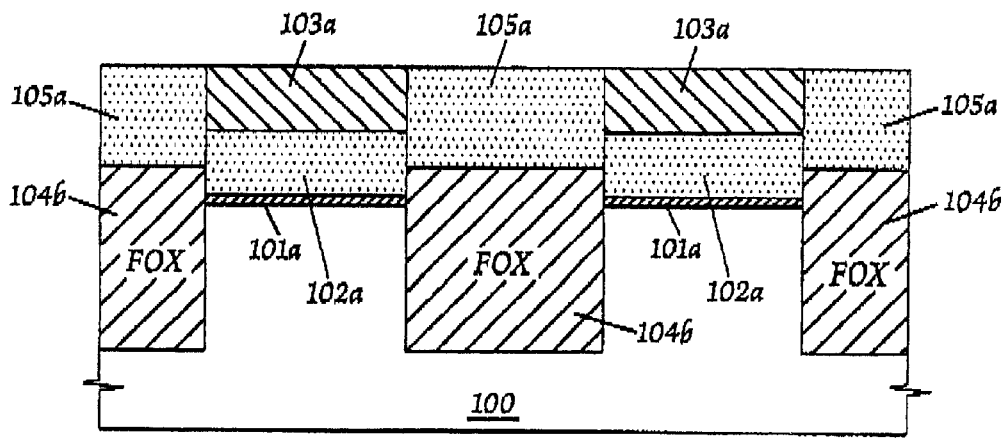

FIG. 3C shows that the planarized field-oxides 104a are anisotropically etched back to a level approximately equal to a half thickness of the first conductive layer 102a and the planarized second conductive layers 105a are formed over the etched-back gaps. The planarized second conductive layer 105a is first formed by depositing a second conductive layer 105 to fill-up the etched-back gaps and then planarizing the second conductive layer 105 using CMP with the first masking dielectric layer 103a as a polishing stop. The second conductive layer 105 is preferably a doped polycrystalline-silicon layer or a doped amorphous-silicon layer as deposited by LPCVD.

Figure 3D:
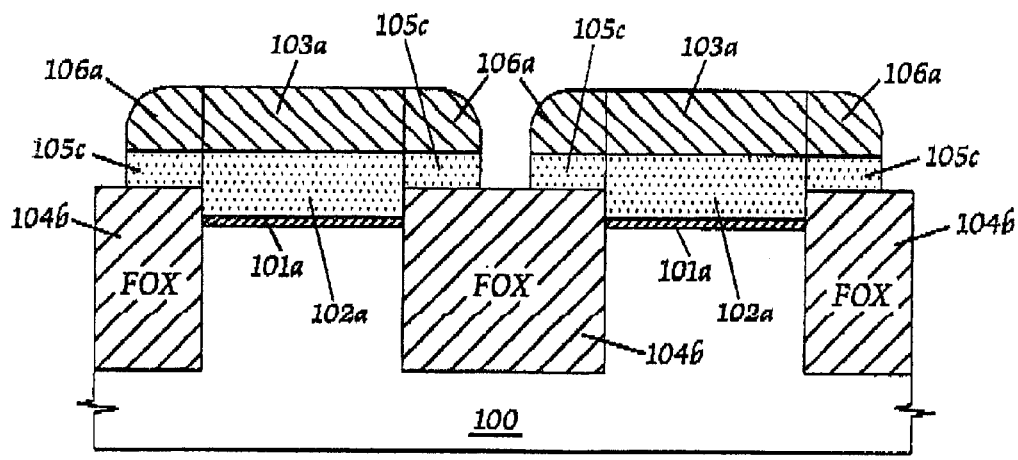

FIG. 3D shows that the planarized second conductive layers 105a are etched back to a level approximately equal to a thickness of the first masking dielectric layer 103a and the first dielectric spacers 106a are formed over the sidewalks of the first masking dielectric layer 103a. The first dielectric spacers 106a are formed by depositing a first dielectric layer 106 and etching back anisotropically the thickness of the first dielectric layer 106. Note that the spacer width is approximately equal to the thickness of the first dielectric layer 106. The first dielectric spacer 106a is preferably made of silicon-nitrides deposited by LPCVD. Using the first dielectric spacers 106a and the first masking dielectric layers 103a as the etching mask, the etched-back second conductive layers 105b are anisotropically etched to form the extended floating-gate layers 105c, as shown in FIG. 3D.

Figure 3E:
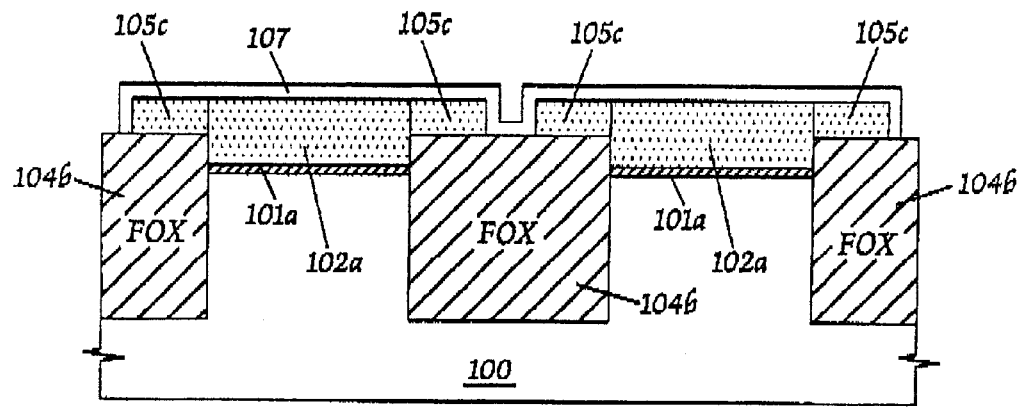

FIG. 3E shows that the first masking dielectric layers 103a and the first dielectric spacers 106a are removed preferably by hot-phosphoric acid and an intergate dielectric layer 107 is then formed over the structure. The intergate dielectric layer 107 is preferably a composite dielectric layer of an oxide-nitride-oxide (ONO) structure or a nitride-oxide structure having an equivalent oxide thickness of about 100 Å.

Figure 3F:
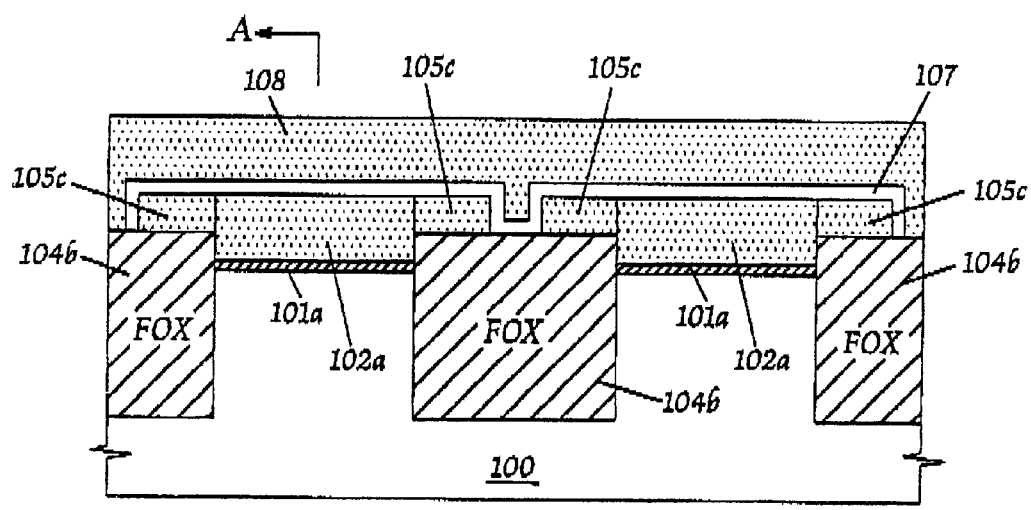

FIG. 3F shows that the third conductive layer 108 is deposited on the intergate dielectric layer 107. The third conductive layer 108 is preferably a composite conductive layer of a tungsten-silicide ($WSi_2$) layer over a doped polycrystalline-silicon layer. From FIG. 3F, it is clearly seen that the integrated floating-gate layer consisting of a major floating-gate layer 102a and two extended floating-gate layers 105c may largely increase the coupling ratio of the floating-gate and the width of the extended floating-gate layer 105c can be easily controlled by the spacer width without using the extra masking photoresist steps. Moreover, the surface of the third conductive layer 108 is rather flat for fine-line lithography.

Figure 4A:
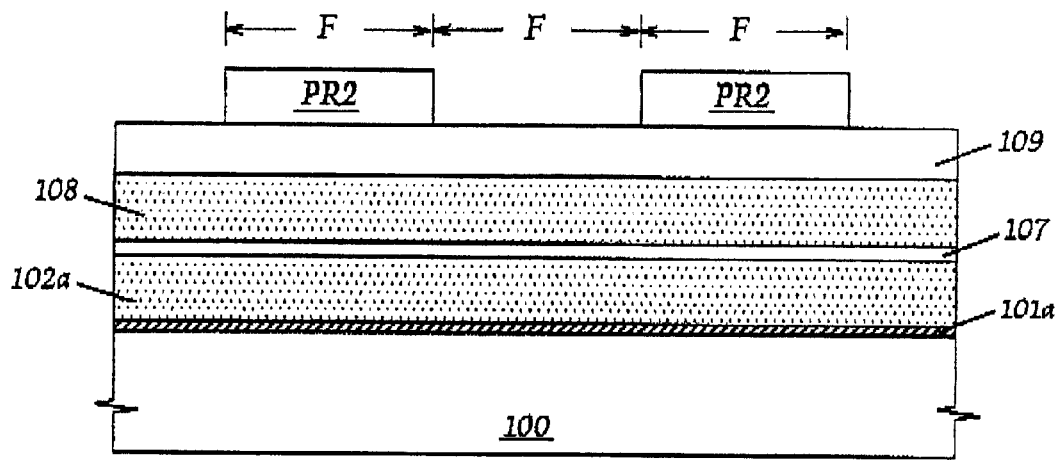
FIG. 4A through FIG. 4I show the process steps and their cross-sectional views of fabricating a contactless NOR-type flash memory array.

Referring now to FIG. 4A through FIG. 4I, there are shown the process steps and their cross-sectional views along A–A' shown in FIG. 2A for fabricating a contactless NOR memory array based on the isolation structure shown in FIG. 3F. As shown in FIG. 4A, an interlayer dielectric layer 109 is formed over the third conductive layer 108 as shown in FIG. 3F. The interlayer dielectric layer 109 is preferably a second masking dielectric layer formed over a first thick-oxide layer (not shown). The second making dielectric layer is preferably a silicon-nitride layer having a thickness between 200 Å and 1000 Å, as deposited by LPCVD. The first thick-oxide layer is preferably deposited by LPCVD and its thickness is between 2000 Å and 5000 Å. The patterned photoresist PR2 is formed over the interlayer dielectric layer 109 to define the word lines (under PR2) and the common-source/drain diffusion regions (between PR2). It should be noted that the width and the space of PR2 can be defined to be the minimum feature size (F) as shown in FIG. 4A.

Figure 4B:
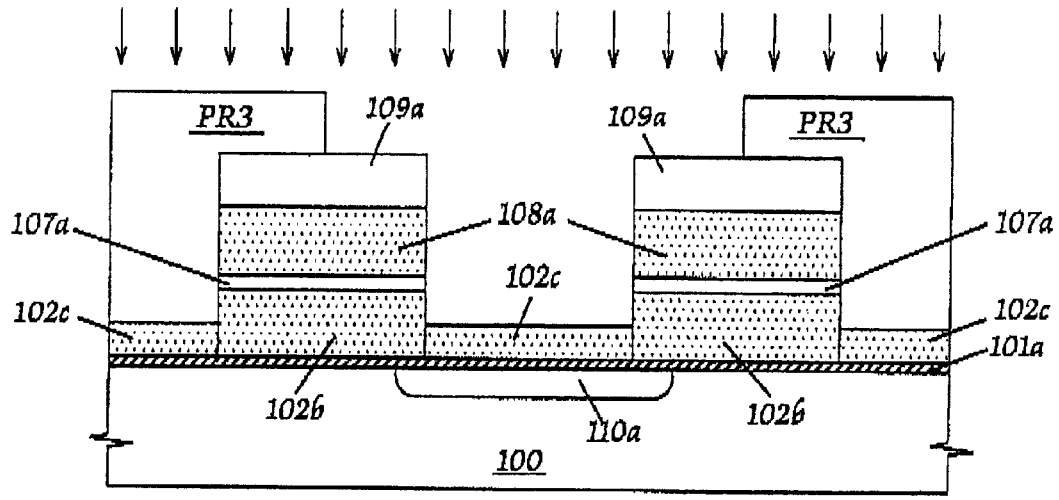
Figure 4C:
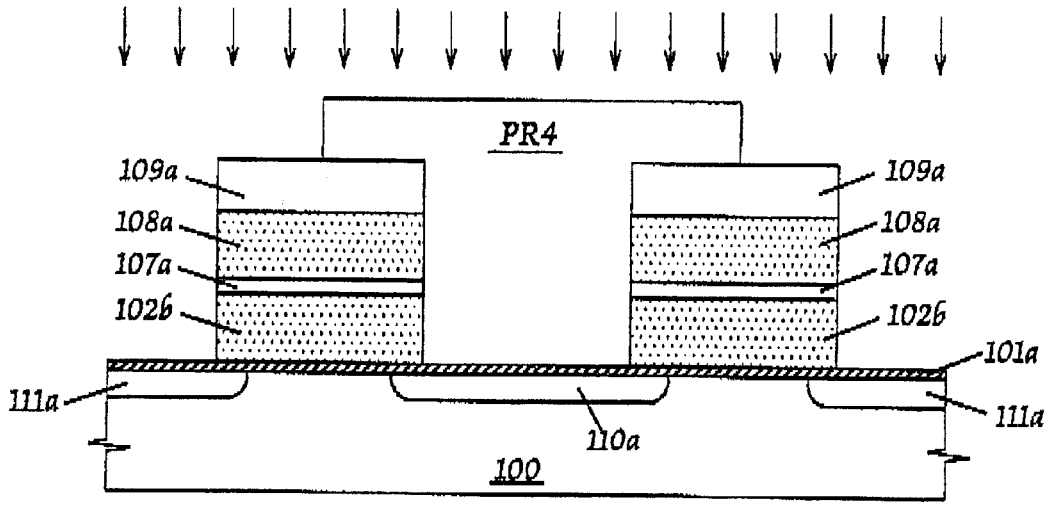

FIG. 4B shows that the interlayer dielectric layer 109, the third conductive layer 108, and the intergate dielectric layer 107 are anisotropically etched, the extended floating-gate layer 105c (as shown in FIG. 3F) is removed, and the major floating-gate layer 102a is partially etched. The patterned photoresist PR3 are formed over the common-drain lines and the part of the interlayer dielectric layers 109a as shown in FIG. 4B, in which the common-source lines are not covered by PR3. Ion implantation can be performed by implanting phosphorous ions ($P^{31}$) across the remained major floating-gate layer 102c and the thin tunneling dielectric layer 101a into the semiconductor substrate 100 in a self-aligned manner to form the lightly-doped source diffusion regions 110a and, subsequently, the planarized field-oxides 104b (shown in FIG. 3F) along the common-source lines are etched back to a level slightly higher the top level of the thin tunneling-dielectric layer 101a in order to form a flat bed later, FIG. 4C shows that the patterned photoresist PR3 are stripped, the remained major floating-gate layers 102c over the common-source/drain lines are selectively removed, and then a patterned photoresist PR4 are formed over the common-source lines and the part of the interlayer dielectric layers 109a to expose the common-drain lines. Ion implantation is performed by implanting boron ions ($B^{11}$) across the thin tunneling dielectric layer 101a into the semiconductor substrate 100 to form p-diffusion regions 111a for the common-drain diffusion regions. It should be noted that the p-diffusion region formed in the common-drain diffusion regions may enhance the lateral electric field near the drain edge to improve the hot-electron-injection efficiency for programming and may also increase the punch-through voltage of the stack-gate cells. If the p-diffusion regions 111a are not required, the patterned photoresist PR4 can be omitted.

Figure 4D:
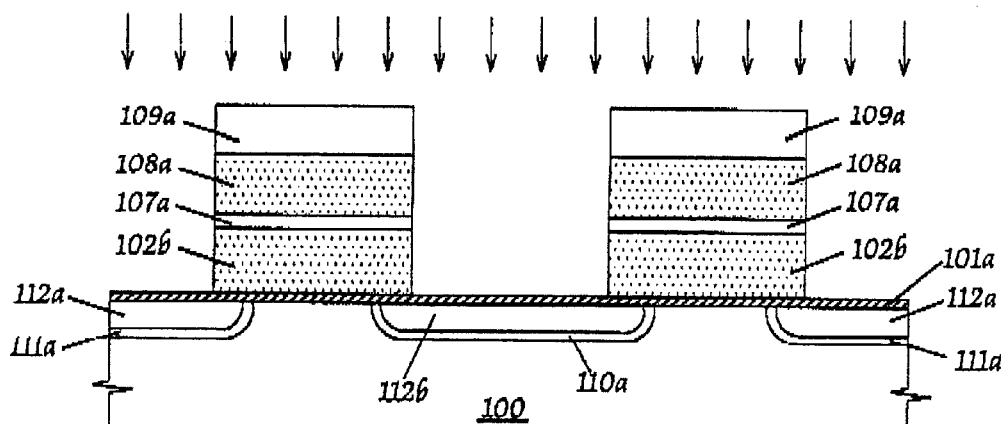

FIG. 4D shows that the patterned photoresist PR4 are stripped and ion-implantation is performed by implanting arsenic ions ($As^{75}$) across the thin tunneling dielectric layers 101a into the common-source diffusion regions to form the heavily-doped n+ source-diffusion regions 112b and the common-drain diffusion regions to form the heavily-doped $n^+$ drain-diffusion regions 112a. Similarly, if the p-diffusion region in the common-drain diffusion regions is removed (PR4 is omitted), the common-drain diffusion region becomes a heavily-doped $n^+$ drain diffusion region.

Figure 4E:
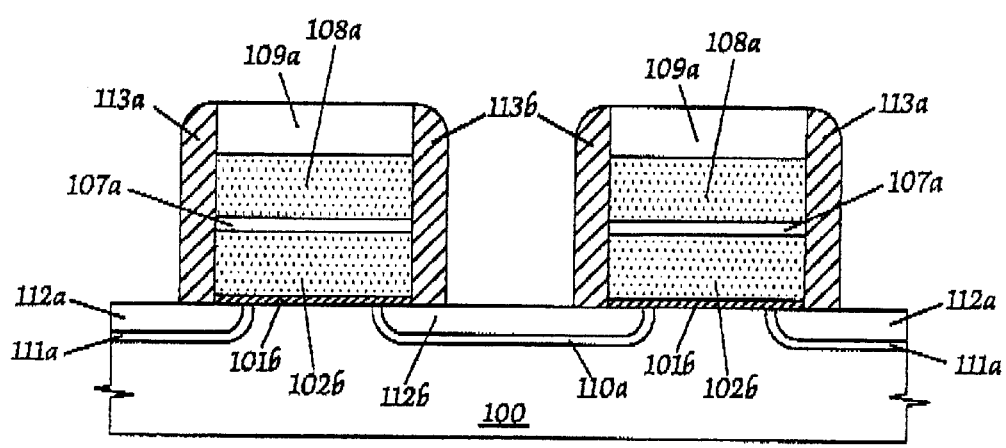

FIG. 4E shows that the thin tunneling dielectric layers 101a over the common-source/drain diffusion regions 112a, 112b are removed by a dip etching in a dilute hydrofluoric acid and the second dielectric spacers 113a, 113b are formed over the sidewalls of the stack-gate structure along the word lines. The second dielectric spacer 113a, 113b is preferably made of silicon-oxides deposited by LPCVD and the spacer width is preferably between 200 Å and 1500 Å.

Figure 4F:
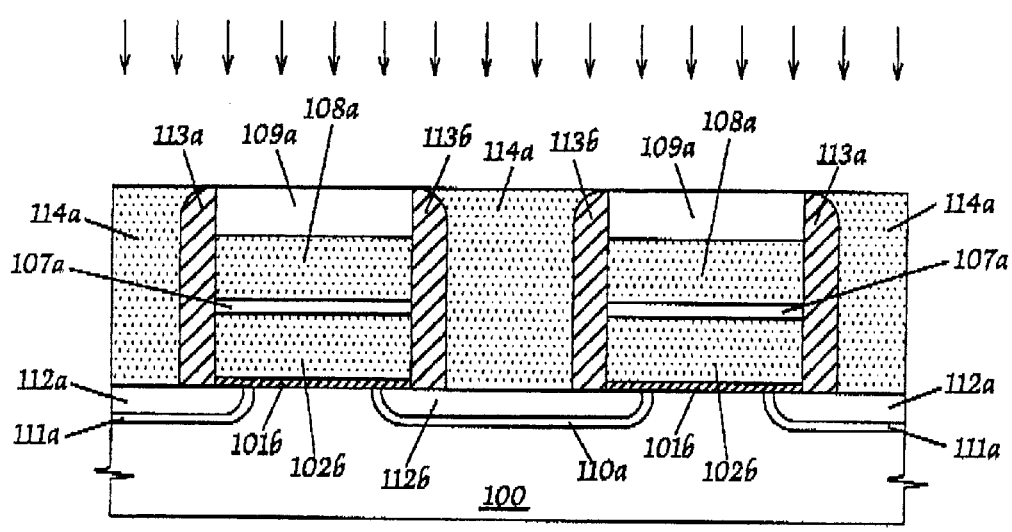

FIG. 4F shows that the planarized fourth conductive layers 114a are formed over the common-source/drain diffusion regions and between the second dielectric spacers 113a and 113b. The planarized fourth conductive layers 114a are formed by first depositing a thick fourth conductive layer 114 to fill up the gaps between the second dielectric spacers 113a, 113b and then planarizing the thick fourth conductive layer 114 using CMP with the Interlayer dielectric layer 109a as a polishing stop. The thick fourth conductive layer 114 is preferably made of doped polycrystalline-silicon as deposited by LPCVD. A high-dose ion-implantation is performed to heavily dope the planarized fourth conductive layers 114a and the dopant impurities are preferably phosphorous. Subsequently, a rapid thermal annealing (RTA) is performed to activate and redistribute the implanted impurities.

Figure 4G:
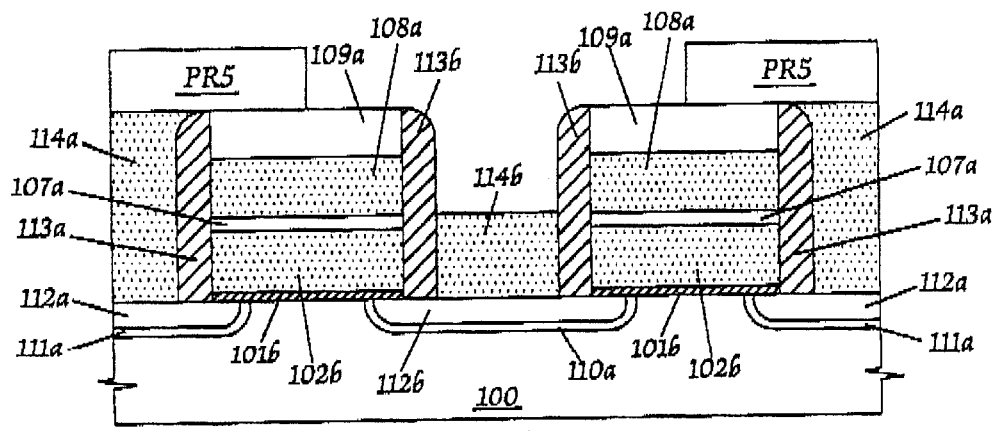

FIG. 4G shows that the patterned photoresist PR5 are formed over the common-drain lines and the part of the interlayer dielectric layers 109a, and then the planarized fourth conductive layers 114a over the common-source lines are etched back to a level approximately equal to the bottom level of the control-gate layer 108a to form a thinner fourth conductive layers 114b over the common-source lines.

Figure 4H:
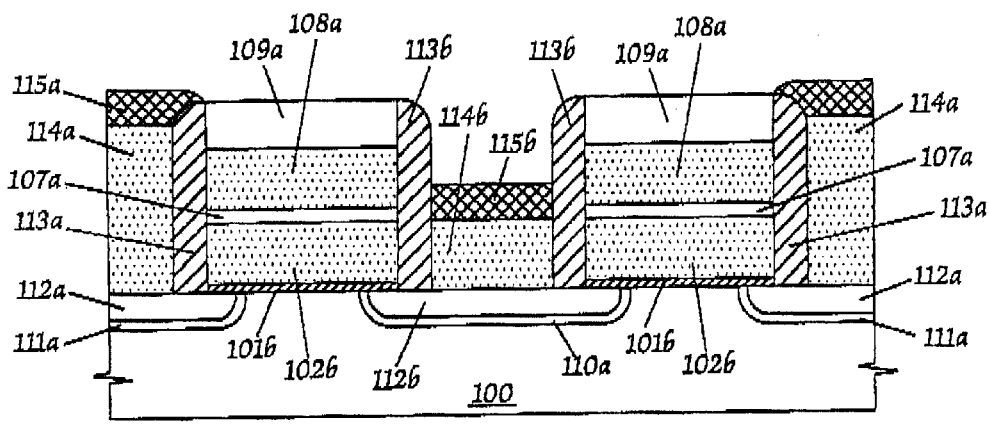

FIG. 4H shows that the patterned photoresist PR5 are stripped and a well-known self-aligned silicidation process is performed to form a silicide layer 115a over the planarized fourth conductive layers 114a and a silicide layer 115b over the thinner fourth conductive layers 114b. The silicide layer 115a, 115b is preferably made of refractory-metal silicide such as $TiSi_2$, $CoSi_2$, $TaSi_2$, $MoSi_2$, $NiSi_2$ or $PtSi_2$ etc..

Figure 4I:
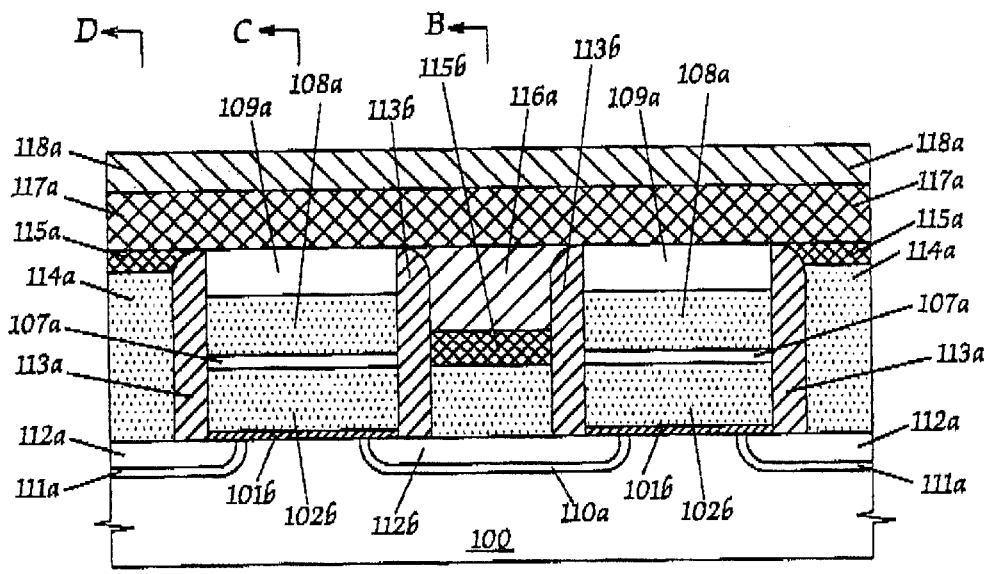

FIG. 4I shows that a first tick-oxide film 116 is deposited to fill up the gaps over the common-source lines as shown in FIG. 4H and CMP is then performed to planarize the second thick-oxide film 116a by using the interlayer dielectric layers 109a as a polishing stop. A metal layer 117 is deposited over the whole structure and a third masking dielectric layer 118 is then deposited over the metal layer 117. The patterned photoresist PR6 (not shown) are formed over the third masking dielectric layer 118 to define the bit lines. In order to eliminate the misalignment between the bit lines and the active-region lines, the third dielectric spacers 119a are formed over the sidewalls of the patterned third masking dielectric layer 118a as shown in FIG. 2D through FIG. 2F, the metal layer 117, the silicide layer 115a and the planarized fourth conductive layer 114a over the common-drain lines are etched, as will be discussed later. The first thick-oxide layer 116 is preferably deposited by CVD or high-density plasma CVD and can be phosphorous-silicate glass (PSG) or pure oxide. The metal layer 117 can be a tungsten-silicide layer, tungsten, aluminum, or copper formed over a barrier-metal layer such as titanium-nitride (TiN) or tantalum-nitride (TaN). The third masking dielectric layer 118 is preferably made of silicon-nitrides, silicon-oxynitrides, or silicon-oxides, as deposited by LPCVD. Similarly, the third dielectric spacer 119a is preferably made of silicon-nitrides, silicon-oxynitrides or silicon-oxides.

Referring now to FIG. 2D through FIG. 2F, there are shown various cross-sectional views as indicated in FIG. 4I. FIG. 2D shows a cross-sectional view along the common-source line as indicated by B–B' in FIG. 4I. It is clearly seen that the thinner fourth conductive layer 114b capped with a silicide layer 115b is formed over a flat bed formed by the common-source diffusion regions 112b and the etched field-oxides 104c. Therefore, the common-source bus line with lower bus-line resistance, lower bus-line capacitance and lower pn junction current leakage can be easily obtained by the present invention. Moreover, the contact integrity for shallow source junction can be much improved by using polysilicon contact. As shown in FIG. 2D, the bit-line 117a is defined by a patterned third masking dielectric layer 118a and two third dielectric spacers 119a, the width of the bit line is wider than a minimum-feature-size F and the misalignment between the bit line and the active region can be reduced. FIG. 2E shows a cross-sectional view along a word line as indicated by C–C' in FIG. 4I. It is clearly seen that the integrated floating-gate layer including a major floating-gate layer 102b and two extended floating-gate layers 105d may largely increase the coupling ratio of the floating-gate. FIG. 2F shows a cross-sectional view along the common-drain line as indicated by D–D' in FIG. 4I. It is clearly visualized that the third dielectric spacers 119a may prevent the misalignment of the bit-line connection between the common-drain diffusion region 112a and the planarized fourth conductive layer 114a, and the etching of the planarized fourth conductive layers 114a will be automatically stopped by the field-oxides 104b. It should be noted that the gaps between the third dielectric spacers 119a can be further filled with a thick CVD oxide film and CMP is performed to planarize the CVD-oxide film using the third masking dielectric layer 118a as a polishing stop.

While the present invention has been particularly shown and described with a reference to the present examples and embodiments as considered, this presentation is to be considered as illustrative and not restrictive. Moreover, the present invention is not to be limited to the details given herein, and it will be understood by those skilled in the art that various changes in form and details may be made without departure from the true spirit and scope of the present invention.

What is claimed is:

1. A contactless NOR-type memory array, comprising:

a semiconductor substrate of a first conductivity type having a plurality of parallel isolation regions, wherein each of a plurality of active regions is formed between two nearby parallel isolation regions;

a plurality of gate regions being defined on said semiconductor substrate and transversely to the plurality of parallel isolation regions, wherein each of the plurality of gate regions is formed between a common-source region and a common drain-region; each of the plurality of gate regions comprising an elongated control-gate layer being sandwiched between an interlayer dielectric layer formed on its top and an intergate dielectric layer formed at its bottom to act as a word line and a plurality of integrated floating-gate layers being formed beneath said intergate dielectric layer, wherein each of the plurality of integrated floating-gate layers comprises a major floating-gate layer being formed on a thin tunneling-dielectric layer in said active region and two extended floating gate layers being formed separately on side portions of said two nearby parallel isolation regions;

said common-source region comprising a plurality of common-source diffusion regions being formed in first surface portions of said semiconductor substrate in the plurality of active regions, a pair of first dielectiic spacers being formed over first sidewalls of nearby gate regions and on a first flat bed being formed alternately by said common-source diffusion region in said active region and an etched raised field-oxide layer in said parallel isolation region, a common-source conductive layer being formed over said first flat bed between said pair of first dielectric spacers, and a second thick-oxide layer being formed over said common-source conductive layer;

said common-drain region comprising a plurality of common-drain diffusion regions being formed in second surface portions of said semiconductor substrate in the plurality of active regions, a pair of second dielectric spacers being formed over second sidewalls of nearby gate regions and a plurality of common-drain conductive islands being formed between said pair of second dielectric spacers, wherein each of the plurality of common-drain conductive islands is formed over a portion of said common drain diffusion region and its neat-by raised field-oxide layers; and a plurality of bit lines being formed above the plurality of active regions and transversely to the plurality of word lines, wherein each of the plurality of bit lines is formed over said second thick-oxide layers in said common-source regions, said interlayer dielectric layers in said gate regions and said common-drain conductive islands in said common-drain regions and a hard masking layer is formed over a metal layer to simultaneously pattern and form said metal layer and said common-drain conductive islands to form a bit line being integrated with said common-drain conductive islands.

2. The contactless NOR-type memory array according to claim 1, wherein the plurality of parallel isolation regions are formed by using shallow-trench-isolation (STI) technique.

3. The contactless NOR-type memory array according to claim 1, wherein the plurality of parallel isolation regions are formed by using local-oxidation of silicon (LOCOS) technique.

4. The contactless NOR-type memory array according to claim 1, wherein said elongated control-gate layer comprises a composite conductive layer having a refractory-metal silicide layer formed over a doped polycrystalline-silicon layer.

5. The contactless NOR-type memory array according to claim 1, wherein said interlayer dielectric layer comprises a composite dielectric layer having a capping silicon-nitride layer formed on a first thick-oxide layer, a silicon-oxynitride layer or an insulator layer of low dielectric constant.

6. The contactless NOR-type memory array according to claim 1, wherein said integrate dielectric layer comprises a composite dielectric layer having an oxide-nitride-oxide structure or a nitride-oxide structure.

7. The contactless NOR-type memory array according to claim 1, wherein said integrated floating-gate layer comprises a doped polycrystalline-silicon or doped amorphous-silicon layer.

8. The contactless NOR-type memory array according to claim 1, wherein said first dielectric spacer and said second dielectric spacer comprises silicon-oxide, silicon-oxynitride, silicon-nitride, or a dielectric material of low dielectric constant.

9. The contactless NOR-type memory array according to claim 1, wherein said common-source conductive layer and said common-drain conductive island comprise a refractory-metal silicide layer being formed on a doped polycrystalline-Silicon or doped amorphous-silicon layer and a doped polycrystalline-Silicon or doped amorphous-silicon island, respectively.

10. The contactless NOR-type memory array according to claim 1, wherein said metal layer comprises aluminum (Al), copper (Cu), tungsten (W), or tungsten-suicide (WSi$_2$) on a barrier-metal layer.

11. The contactless NOR-type memory array according to claim 1, wherein said hard masking layer including a masking dielectric layer and its two sidewall dielectric spacers comprises silicon-nitride, silicon-oxide or silicon-oxynitride.

12. The contactless NOR-type memory array according to claim 1, wherein said common-Source diffusion region comprises a double-diffused structure having a heavily-doped source diffusion region of a second conductivity type being formed within a lightly-doped source diffusion region of said second conductivity type and said common-drain diffusion region comprises a heavily-doped drain diffusion region of said second conductivity type.

13. The contactless NOR-type memory array according to claim 1, wherein said common-source diffusion region comprises a double-diffused structure having a heavily-doped source diffusion region of a second conductivity type being formed within a lightly-doped source diffusion region of said second conductivity type and said common-drain diffusion region comprises a double-diffused structure having a heavily-doped drain diffusion region of said second conductivity type being formed within a moderately-doped drain diffusion region of said first conductivity type.

14. The contactless NOR-type memory array according to claim 1, wherein said common-source diffusion region and said common-drain diffusion region comprises a double-diffused structure having a heavily-doped source/drain diffusion region of a second conductivity type being formed within a lightly-doped source/drain diffusion region of said second conductivity type.

15. A contactless NOR-type memory array, comprising:

a semiconductor substrate of a first conductivity type having a plurality of parallel isolation regions, wherein each of a plurality of active regions is formed between two nearby parallel isolation regions;

a plurality of gate regions being defined on said semiconductor substrate and transversely to the plurality of parallel isolation regions, wherein each of the plurality of gate regions is formed between a common-source region and a common drain-region;

each of the plurality of gate regions comprising an elongated polycide-gate layer being sandwiched between an interlayer dielectric layer formed on its top and an intergate dielectric layer formed at its bottom to act as a word line and a plurality of integrated floating-gate layers being formed beneath said intergate dielectric layer, wherein each of the plurality of integrated floating gate layers comprises a major floating-gate layer being formed on a thin tunneling-dielectric layer in said active region and two extended floating-gate layers being formed separately on side portions of said two nearby parallel isolation regions;

said common-source region comprising a plurality of common-source diffusion regions of a second conductivity type being formed in first surface portions of said semiconductor substrate in the plurality of active regions, a pair of first dielectric spacers being formed over first sidewalls of nearby gate regions and on a first flat bed being formed alternately by said common-source diffusion region in said active region and an etched raised field-oxide layer in said parallel isolation legion, a silicided heavily-doped polycrystalline-silicon layer being formed over said first flat bed between said pair of first dielectric spacers, and a second thick-oxide layer being formed over said common-source conductive layer, wherein each of the plurality of common-source diffusion regions comprises a heavily-doped common-source diffusion region being formed within a lightly-doped common-source diffusion regions;

said common-drain legion comprising a plurality of common-drain diffusion regions being formed in second surface portions of said semiconductor substrate in the plurality of active regions, a pair of second dielectric spacers being formed over second sidewalls of nearby gate regions and a plurality of silicided heavily-doped polycrystalline-silicon islands being formed between said pair of second dielectric spacers, wherein each of the plurality of silicided heavily-doped polycrystalline-silicon islands is formed over a portion of said common-drain diffusion region and its nearby raised field-oxide layers; and a plurality of bit lines being formed above the plurality of active regions and transversely to the plurality of word lines, wherein each of the plurality of bit lines is formed over said second thick-oxide layers in said common-source regions, said interlayer dielectric layers in said gate regions and said silicided heavily-doped polycrystalline-silicon islands in said common-drain regions and a hard masking layer is formed over a metal layer to simultaneously pattern and form said metal layer and said silicided heavily-doped polycrystalline-silicon islands to form a bit line being integrated with said silicided heavily-doped polycrystalline-silicon islands.

16. A contactless NOR-type memory array, comprising:

a semiconductor substrate of a first conductivity type having a plurality of parallel isolation regions, wherein each of a plurality of active regions is formed between two nearby parallel isolation regions;

a plurality of gate regions being defined on said semiconductor substrate and transversely to the plurality of parallel isolation regions, wherein each of the plurality of gate regions is formed between a common-source region and a common drain-region;

each of the plurality of gate regions comprising an elongated polycide-gate layer being sandwiched between an interlayer dielectric layer formed on its top and an intergate dielectric layer formed at its bottom to act as a word line and a plurality of integrated floating-gate layers being formed beneath said intergate dielectric layer, wherein each of the plurality of integrated floating-gate layers comprises a major floating-gate layer being formed on a thin tunneling-dielectric layer in said active region and two extended floating-gate layers being formed separately on side portions of said two nearby parallel isolation regions;

said common-source region comprising a plurality of common-source diffusion regions of a second conductivity type being formed in first surface portions of said semiconductor substrate in the plurality of active regions, a pair of first dielectric spacers being formed over first sidewalls of nearby gate regions and on a first flat bed being formed alternately by said common-source diffusion region in said active region and an etched raised field-oxide layer in said parallel isolation region, a common-source conductive layer being formed over said first flat bed between said pair of first dielectric spacers, and a second thick-oxide layer being formed over said common-source conductive layer, wherein each of the plurality of common-source diffusion regions comprises a heavily-doped common-source diffusion region being formed within a lightly-doped common-source diffusion region;

said common-drain region comprising a plurality of common-drain diffusion regions being formed in second surface portions of said semiconductor substrate in the plurality of active regions, a pair of second dielectric spacers being formed over second sidewalls of nearby gate regions and a plurality of silicided heavily-doped polycrystalline-silicon islands being formed between said pair of second dielectric spacers, wherein each of the plurality of silicided heavily-doped polycrystalline-silicon islands is formed over a portion of said common-drain diffusion region and its nearby raised field-oxide layers, wherein each of the plurality of common-drain diffusion regions comprises a heavily-doped common-drain diffusion of said second conductivity type being formed within a moderately-doped common-drain diffusion of said first conductivity type; and a plurality of bit lines being formed above the plurality of active regions and transversely to the plurality of word line wherein each of the plurality of bit lines is formed over said second thick-oxide layers in said common-source regions, said interlayer dielectric layers in said gate regions and said silicided heavily-doped polycrystalline-silicon islands in said common-drain regions and a hard masking layer is formed over a metal layer to simultaneously pattern and form said metal layer and said common-drain conductive islands to form a bit line being integrated with said silicided heavily-doped polycrystalline-silicon islands.

17. The contactless NOR-type memory array according to claim 16, wherein said first dielectric spacer and said second dielectric spacer comprise silicon-oxide, silicon-oxynitride, silicon-nitride or a dielectric material of low dielectric constant.

18. The contactless NOR-type memory array according to claim 16, wherein said silicided heavily-doped polycrystalline-silicon layer and said silicided heavily-doped polycrystalline-silicon island comprise a refractory-metal silicide layer over a heavily-doped polycrystalline-silicon layer and a heavily-doped polycrystalline-silicon island, respectively.

19. The contactless NOR-type memory array according to claim 16, wherein said metal layer comprises aluminum (Al), copper (Cu), tungsten (W) or tungsten-silicide ($Wsi_2$) layer being formed over a barrier-metal layer.

20. The contactless NOR-type memory array according to claim 16, wherein said hard masking layer including a masking dielectric layer and its two sidewall dielectric spacer comprises silicon-nitride, silicon-oxynitride or silicon-oxide.

* * * * *